United States Patent [19]

Miyasaka

[11] Patent Number: 5,343,098
[45] Date of Patent: Aug. 30, 1994

[54] SNUBBER CIRCUIT FOR A POWER SEMICONDUCTOR DEVICE

[75] Inventor: Tadashi Miyasaka, Matumoto, Japan

[73] Assignee: Fuji Electric Co., Ltd., Kawasaki, Japan

[21] Appl. No.: 623,347

[22] Filed: Dec. 7, 1990

[30] Foreign Application Priority Data

Dec. 7, 1989 [JP] Japan .................. 1-318466

[51] Int. Cl.$^5$ ................ H03K 17/60; H03K 5/00
[52] U.S. Cl. .................. 307/570; 307/253; 307/520; 307/542
[58] Field of Search ........... 307/253, 520, 542, 542.1, 307/570, 541, 549, 550, 555, 567, 568; 361/100, 101, 111, 56, 58, 91

[56] References Cited

U.S. PATENT DOCUMENTS

| | | | |
|---|---|---|---|
| 4,131,908 | 12/1978 | Dank et al. | 307/549 |
| 4,251,743 | 2/1981 | Hareyama | 307/254 |
| 4,365,171 | 12/1982 | Archer | 307/542 |
| 4,400,711 | 8/1983 | Avery | 357/43 |
| 4,403,269 | 9/1983 | Carroll | 307/542 |
| 4,551,643 | 11/1985 | Russell et al. | 307/570 |
| 4,613,932 | 9/1986 | Cibulka et al. | 361/100 |
| 4,697,199 | 9/1987 | De Graaff et al. | 307/570 |
| 4,717,996 | 1/1988 | Bourke et al. | 361/56 |
| 4,885,657 | 12/1989 | Grüning | 307/570 |
| 4,894,567 | 1/1990 | Lenk | 307/542 |
| 4,914,540 | 4/1990 | Tabata et al. | 361/91 |
| 4,924,344 | 5/1990 | Guajardo | 361/91 |
| 4,972,292 | 11/1990 | Petersen | 361/56 |

FOREIGN PATENT DOCUMENTS

| | | | |
|---|---|---|---|
| 0063230 | 4/1983 | Japan | 307/542.1 |
| 0010919 | 1/1990 | Japan | 307/542 |

Primary Examiner—Curtis Kuntz
Assistant Examiner—Sinh Tran
Attorney, Agent, or Firm—Brumbaugh, Graves, Donohue & Raymond

[57] ABSTRACT

A snubber circuit, for absorbing voltage spikes applied to a power semiconductor device used as a switching means, utilizes the junction capacitance of a directly connected semiconductor device, thereby avoiding the need for a separate high-voltage capacitor. Embodiments shown use either a MOSFET or a bipolar transistor with a resistor connected in parallel between the gate (base) and the source (emitter) of the MOSFET (or bipolar transistor.) The snubber circuit of the present invention may also be a module integrally formed on a radiating base of the power semiconductor device.

1 Claim, 2 Drawing Sheets

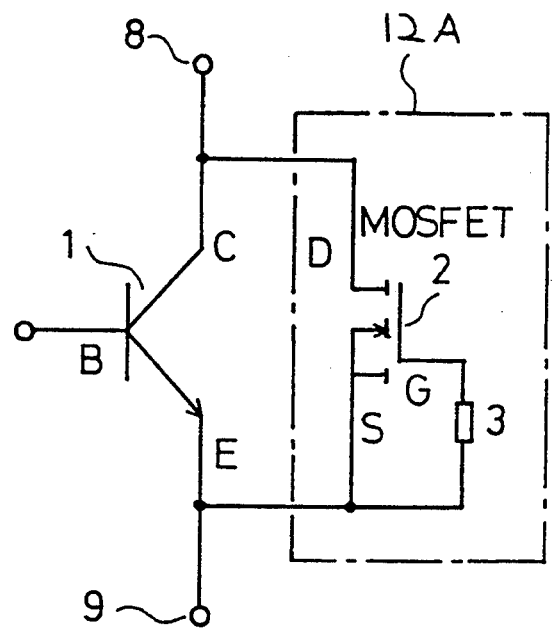
1
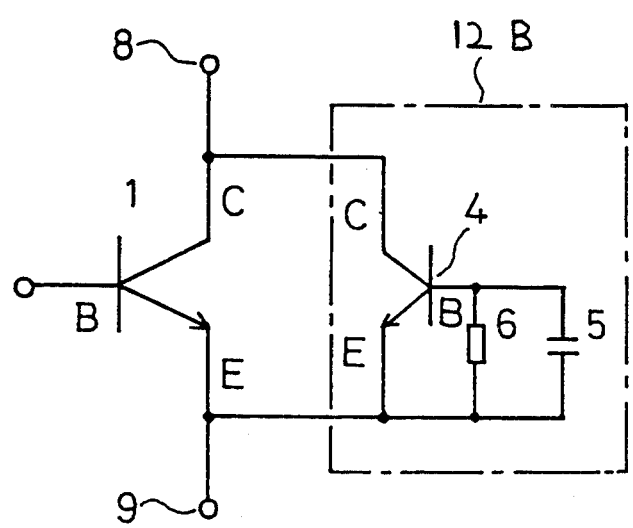
2

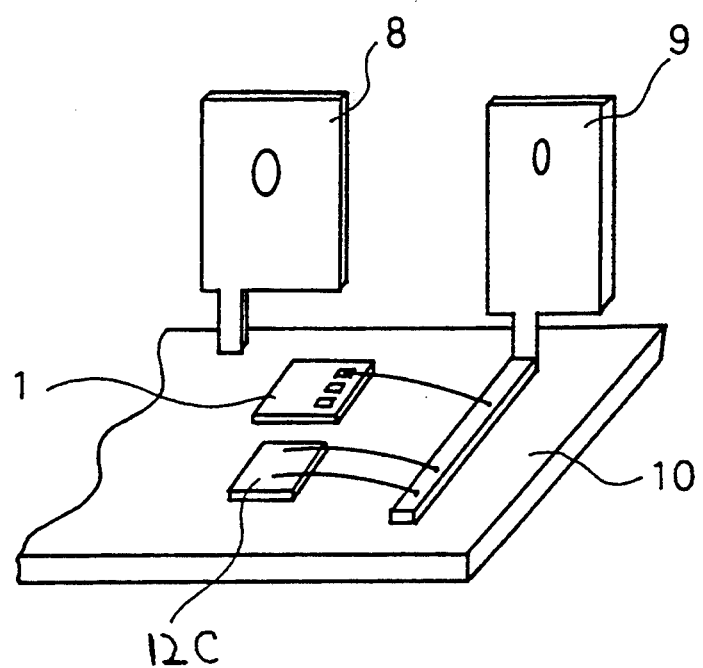
3

SNUBBER CIRCUIT FOR A POWER SEMICONDUCTOR DEVICE

BACKGROUND OF THE INVENTION

The present invention relates to a snubber circuit for suppressing voltage spikes applied to a power semiconductor device in a power converter using the power semiconductor device as a switching element. More particularly, the present invention relates to an improved snubber circuit for a power semiconductor device which can be reduced in size.

In a conventional snubber circuit of this kind, a diode, a resistor and a capacitor, or a Zener diode and a capacitor are connected in series, and the series circuit is connected in parallel to a power semiconductor device, the device to be protected, so that a spike voltage is suppressed by a current charged to the capacitor. In such a snubber circuit, however, a transient forward voltage of 30 to 60 V is applied while the diode is turned on and the voltage rises to 60 to 100 V due to the wiring inductance of the snubber circuit until the circuit provides a snubber function. In addition, separate parts such as a diode, resistor and capacitor are connected to each other, making reduction in size difficult and introducing inductance which slows down operation.

Accordingly, it is an object of the present invention to provide a snubber circuit for a power semiconductor device which can remove the above-described problems in the prior art.

SUMMARY OF THE INVENTION

In order to solve the above-described problems, a snubber system according to the present invention includes a snubber circuit for absorbing voltage spikes applied to a power semiconductor device used as a switching device. The snubber circuit of the present invention comprises: a MOSFET (or, alternatively, a bipolar transistor) with the drain (collector) and the source (emitter) connected to at least the anode and the cathode of the power semiconductor device, respectively, and a resistor connected in parallel between the gate (base) and the source (emitter) of the MOSFET (or bipolar transistor.)

The snubber circuit of the present invention may also be a module integrally formed on a radiating base of the power semiconductor device. As will be described further, by avoiding the prior art requirement for a separate high voltage capacitor, the present invention makes such integral construction possible.

The MOSFET or bipolar transistor snubber element is connected in parallel to a power semiconductor device and, only when high dv/dt is applied, the transistor is turned ON so as to consume the energy stored on the wiring by the transistor, thereby suppressing the spike voltage. Thus, the invention utilizes the junction capacitance (Cj) between the drain (collector) and the gate (base) of a MOSFET (or a bipolar transistor), and when dv/dt is applied, a current of $i = Cj \times dv/dt$ flows. The current i turns ON the transistor, thereby enabling the suppression of the spike voltage.

In the snubber circuit of the present invention it is possible to reduce the size of the circuit since there is almost no transient forward voltage of the transistor and a separate high voltage capacitor is not used. As the circuit can be reduced in size, the snubber circuit of the present invention may be a module integrally formed with the power semiconductor device.

BRIEF DESCRIPTION OF THE DRAWINGS

The above and further advantages of the present invention will be better understood with respect to the following description of the preferred embodiments, taken in combination with the several figures of the associated drawings in which:

FIG. 1 shows a first embodiment of a snubber circuit according to the present invention.

FIG. 2 shows a second embodiment of a snubber circuit according to the present invention.

FIG. 3 shows a third embodiment of a snubber circuit according to the present invention.

DESCRIPTION OF THE PREFERRED EMBODIMENTS

The present invention will be explained with reference to FIGS. 1 to 3.

FIG. 1 shows a first embodiment of a snubber system according to the present invention, which is mainly composed of a MOSFET. In FIG. 1, the reference numeral 1 represents a power semiconductor device (a bipolar transistor in this embodiment), which is to be protected. The reference numeral 12A represents a snubber circuit. In this snubber circuit, a snubber semiconductor means, shown as MOSFET 2, is connected in parallel between the corresponding electrodes (anode and cathode electrodes), i.e., collector C and the emitter E, of the power semiconductor device 1, and a resistive means, shown as resistor 3, is connected between the anode and cathode electrodes, i.e., gate G and the source S, of the MOSFET 2. Reference numerals 8 and 9 represent the collector terminal and the emitter terminal of the power semiconductor device 1, respectively.

When steep dv/dt is applied across (between the collector C and the emitter E) the power semiconductor device 1, the junction current i in the MOSFET 2 charges a junction capacitance (not shown) between the drain and the gate, thereby turning ON the MOSFET 2. After dv/dt disappears, the junction capacitance is discharged through the resistor 3 and the MOSFET 2 is turned OFF. It is therefore possible to control the period in which the MOSFET 2 is ON by the value of the resistor 3, thereby controlling the amount of energy consumed by the MOSFET 2 and, hence, the value of the spike voltage. Thus, the resistor 3 provides a resistive discharge path which is determinative of the turn-off time of the snubber system.

FIG. 2 shows a second embodiment of a snubber circuit according to the present invention, which is mainly composed of a bipolar transistor. In FIG. 2, the reference numeral 12B represents a snubber circuit. The collector C and the emitter E of a bipolar transistor 4, a snubber circuit element, are connected to the collector C and the emitter E of the power semiconductor device 1 (a bipolar transistor in this embodiment), respectively. In this case, a capacitor 5 and a resistor 6 are respectively connected in parallel between the base B and the emitter E of the transistor 4.

In FIG. 2, when dv/dt is applied to the power semiconductor device 1, a current flows in the junction capacitor between the collector and the base in the bipolar transistor 4, thereby turning ON the bipolar transistor. At this time, a part of the current charging the junction capacitance charges the capacitor 5. Therefore, after dv/dt disappears, the charge of the capacitor 5 discharges not only the resistor 6 but also the base/emitter circuit of the bipolar transistor 4, whereby the transistor 4 maintains the ON state for a while. By selecting the values of the capacitor 5 and the resistor 6, it is possible to control the period in which the transistor 4 is ON. Capacitor 5, however, is not essential in the present invention, which will operate effectively with the discharge path provided by resistor 6 even in the absence of capacitor 5.

FIG. 3 shows the structure of a third embodiment of the present invention. In this embodiment the snubber circuit shown in FIG. 1 or 2 and a freewheel diode are provided in one chip and form a module which can be used in conjunction with a power semiconductor device. In FIG. 3, the reference numeral 1 represents a power semiconductor device integrally provided with the freewheel diode, a snubber circuit (12C) formed as a one chip, and a radiating base 10 providing a heat sink function.

According to the first and second embodiments of the present invention, the snubber circuit 01 which absorbs the spike voltage applied to a power semiconductor device 1, as a switching means for switching the circuit, comprises either a MOSFET 2 (or a bipolar transistor 4) with the drain (collector) and the source (emitter) connected to at least the anode and the cathode of the power semiconductor device, respectively, and a resistor 3 (6) connected in parallel between the gate (base) and the source (emitter) of the MOSFET (bipolar transistor). Because the circuit dispenses with a snubber capacitor having a high withstand voltage, the circuit may be reduced in size. Since it is possible to control the period in which the transistor for snubber is ON utilizing the gate (base) resistor and the capacitor between the base and the emitter, it is possible to suppress the spike voltage to a desired value. In addition, the snubber circuit of the present invention is not influenced by capacitor frequency characteristics and its application is not limited by switching speed, since a snubber element having the same switching speed as the power semiconductor device may be provided in accordance with the invention.

According to the third embodiment of the present invention, the snubber circuit of the first or second embodiments of the present invention is provided on the radiating base 10 of the power semiconductor device 1 as a module integral with the power semiconductor device 1. Thus, a separate snubber circuit requiring interconnections to the power semiconductor device is no longer needed. It is possible to simultaneously release the energy, which is generated when the snubber circuit absorbs the spike voltage, from the radiator fin to the ambient air. It is also possible to suppress the spike voltage generated by the wiring inductance of the collector terminal 8 and the emitter terminal 9 in the module of the power semiconductor device, thereby safely preventing the breakage of the power semiconductor device due to an overvoltage.

I claim:
1. A snubber system, for suppressing voltage spikes applied to a switching circuit comprising:
   a power semiconductor device, having anode, cathode and control electrodes, which is subject to undesirable voltage spikes applied between said anode and cathode electrodes;
   snubber semiconductor means, comprising a bipolar transistor having anode and cathode electrodes respectively connected to the corresponding electrodes of said power semiconductor device, for providing a low inductance coupled junction capacitance responsive to the steeply rising leading edge of said voltage spikes for causing said snubber semiconductor means to rapidly turn on to suppress said voltage spikes;
   resistive means, connected between said cathode electrode and a control electrode of said snubber semiconductor means, for providing a junction capacitance resistive discharge path determinative of the turn-off time of said bipolar transistor; and
   a capacitor connected in parallel with said resistive means;
   whereby, improved suppression efficiency is provided by rapid turn-on in the absence of excess inductance and resistance controlled turn-off of the snubber semiconductor means.

* * * * *